United States Patent [19]

Roy

[11] Patent Number: 4,742,020
[45] Date of Patent: * May 3, 1988

[54] MULTILAYERING PROCESS FOR STRESS ACCOMMODATION IN DEPOSITED POLYSILICON

[75] Inventor: Pradip K. Roy, Reading, Pa.

[73] Assignee: American Telephone and Telegraph Company, AT&T Bell Laboratories, Murray Hill, N.J.

[*] Notice: The portion of the term of this patent subsequent to Dec. 30, 2003 has been disclaimed.

[21] Appl. No.: 680,140

[22] Filed: Feb. 1, 1985

[51] Int. Cl.$^4$ .......................................... H01L 21/471
[52] U.S. Cl. ......................................... 437/61; 437/67; 437/79; 437/233; 437/235; 437/976; 437/978; 357/49
[58] Field of Search ............... 148/DIG. 25, DIG. 55, 148/DIG. 86, DIG. 122, DIG. 135; 357/49; 437/61, 67, 79, 976, 978, 233, 235

[56] References Cited

U.S. PATENT DOCUMENTS

| | | | |
|---|---|---|---|
| 3,856,647 | 12/1974 | Blachman | 204/192 R |
| 3,862,852 | 1/1975 | Kamins | 117/106 |
| 3,930,067 | 12/1975 | Gorrissen | 148/DIG. 25 X |
| 4,012,756 | 3/1977 | Chaudhari et al. | 357/5 |
| 4,079,506 | 3/1978 | Suzuki et al. | 29/576 W |
| 4,087,571 | 5/1978 | Kamins et al. | 148/174 X |
| 4,173,674 | 11/1979 | Mimura et al. | 29/576 W X |
| 4,191,788 | 3/1980 | Harrington | 427/82 |
| 4,242,697 | 12/1980 | Berthold et al. | 357/49 |
| 4,310,965 | 1/1982 | Horiuchi | 29/580 |
| 4,411,060 | 10/1983 | Cho | 29/576 W |

OTHER PUBLICATIONS

"Warpage of Silicon Wafers", *J. Electrochem Soc.*, vol. 127, No. 4, B. Leroy et al, pp. 961-970.
"Wafer Bow and Warpage", *Jap. J. of Appl. Physics*, vol. 20, Suppl. 20-1, S. Takasu et al, pp. 25-30.
"Deformation in Dielectric-Isolated . . . ", *J. Electrochem. Soc.*, vol. 127, No. 7, T. Suzuki et al, pp. 1537-1542.
"Stress Relief in Heavily Doped . . . ", *J. Appl. Phys.*, vol. 54, No. 2, F. Moser et al, pp. 1033-1036.

*Primary Examiner*—Olik Chaudhuri
*Attorney, Agent, or Firm*—Wendy W. Koba

[57] ABSTRACT

The present invention relates to a process for depositing thick layers of polysilicon which results in less warping or bowing of the wafer unto which the polysilicon is being deposited. This process, referred to as a multilayering deposition process, first consists of the deposition of a continuous, relatively coherent, nucleation layer onto which the multiple layers of polysilicon will be deposited. The multilayering structure is accomplished, according to the invention, by periodically varying one of any selected growth parameter such as, for example, temperature, chemical composition of the polysilicon, or dopant concentration of the polysilicon. The variations are made in a controlled cyclic manner so as to form the multilayered structure. The first deposited nucleation layer undergoes recrystallization after the second deposition cycle as a result of the accommodation to the strain field produced by the multilayering conditions. This recrystallized layer reduces the stress in the polysilicon support structure, thereby reducing the resulting warpage and growth-induced defects in the underlying single crystal substrate.

10 Claims, 10 Drawing Sheets

$T_N = 1100° C$, (15-20 MINUTES)

$T_U = 1180° C$, (10 MINUTES)

$T_L = 1150° C$, (10 MINUTES)

$X_{SiHCl_3} = 0.047$, $X_{H_2} = 0.953$ $T_N = 1100°C$, (15-20 MINUTES)

$T_U = 1180°C$, (10 MINUTES)

$T_L = 1150°C$, (10 MINUTES)

$X_{SiHCl_3} = 0.047$, $X_{H_2} = 0.953$

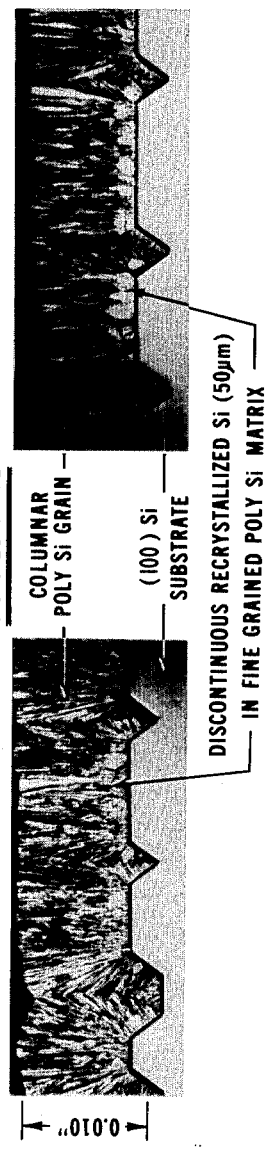
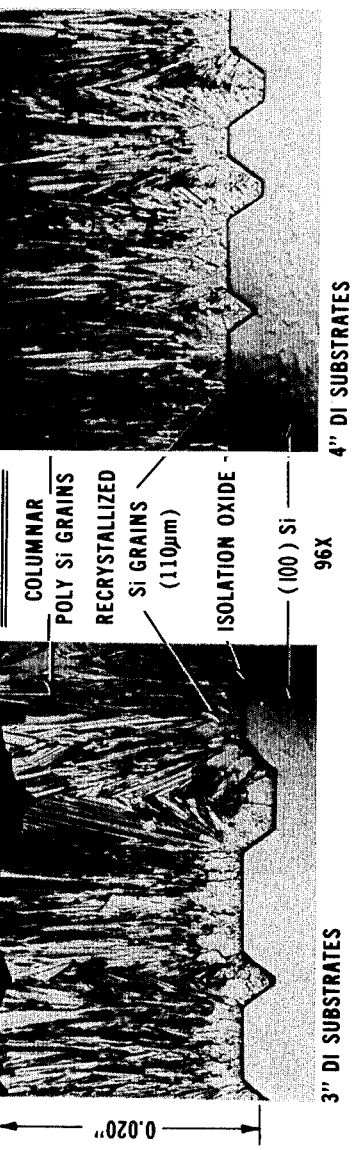
FIG. 3
FIG. 3A
3 CYCLES OF ML
FIG. 3B
7 CYCLES OF ML

FIG. 8
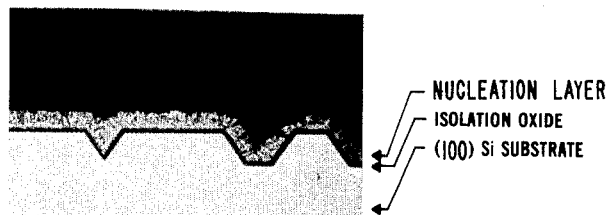
FIG. 8A
NUCLEATION LAYER
ISOLATION OXIDE
(100) Si SUBSTRATE
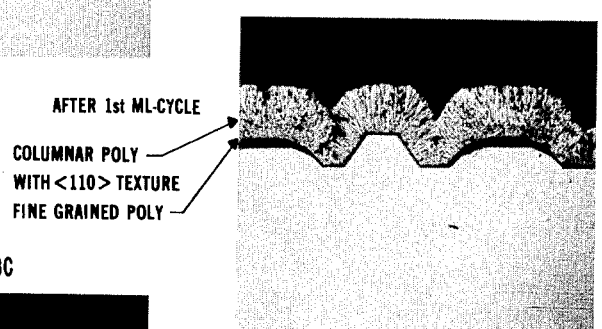
FIG. 8B
AFTER 1st ML-CYCLE
COLUMNAR POLY
WITH <110> TEXTURE
FINE GRAINED POLY
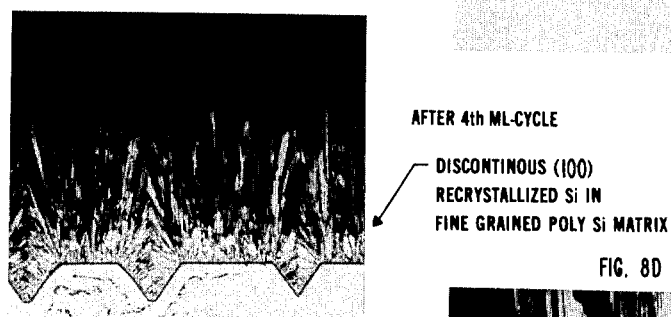
FIG. 8C
AFTER 4th ML-CYCLE
DISCONTINOUS (100)
RECRYSTALLIZED Si IN
FINE GRAINED POLY Si MATRIX
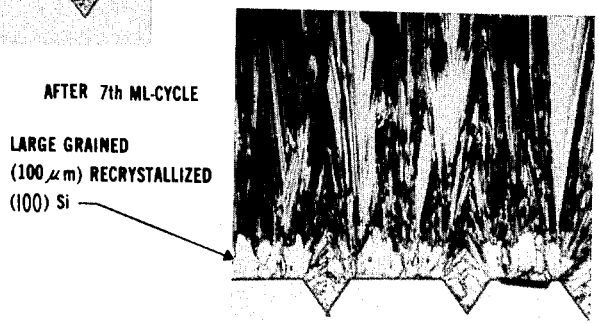
FIG. 8D
AFTER 7th ML-CYCLE
LARGE GRAINED
(100 μm) RECRYSTALLIZED
(100) Si

MULTILAYERING PROCESS FOR STRESS ACCOMMODATION IN DEPOSITED POLYSILICON

BACKGROUND OF THE INVENTION

1. Field of the Invention

The present invention relates to a method of controlling warpage in dielectrically-isolated (DI) silicon wafers utilizing thick layers of polysilicon and, more particularly, to a method of controlling warpage utilizing a multilayering technique for growing polysilicon which consists of alternating growth rates via periodic fluctuations in a preselected growth parameter. This multilayering growth technique results in stress accommodation by substructural layering and stress reduction by strain-induced recrystallization within the polysilicon layer.

2. Description of the Prior Art

In the manufacture of certain types of semiconductor integrated circuits, it is necessary to prepare dielectrically-isolated (DI) single-crystal silicon substrates or dielectrically-isolated (DI) single-crystal regions (or tubs) within the body of a polycrystalline silicon (polysilicon) matrix. Various circuit elements, such as transistors, diodes, capacitors, resistors, etc. may be formed in the single-crystal silicon regions and interconnected with each other to form a monolithic integrated circuit. The continually increasing widespread use of integrated circuits (ICs) requires improved isolation techniques and characteristics beyond those obtainable with p-n junctions. Additionally, junction isolated planar circuits have several limitations that dielectric isolation can substantially impact. In particular, dielectric isolation allows increased packing density, elimination of unwanted SCR action with the substrate (particularly important in crosspoints and radiation-hardened devices), increased operational speed in the circuit by reduction of stray capacitance, and higher collector-base breakdown voltage.

The traditional dielectric isolation technique involves the deposition of a thick polysilicon layer on the oxidized most side of the wafer. Its purpose is to fill the moats and provide both support and a reference surface with respect to which the single crystal substrate can be thinned. The individual isolated single crystal islands embedded in the polysilicon matrix can then easily be handled during subsequent IC processing. A problem with this traditional isolation technique is that the deposition of a thick polysilicon layer is known to create severe, uncontrollable, wafer warpage which is mainly due to the large internal stress generated during polysilicon growth. In contrast, the internal stresses induced by the mismatch in thermal expansion of the polysilicon layer and the (100) silicon substrate are negligible. Therefore, the major deformation of the DI wafer is a consequence of the growth kinetics of the polysilicon. During high temperature silicon growth, the polysilicon buried behind the advancing interface of the growing layer tries to contract perpendicular to the growth direction via material transport across grain boundaries. This contraction leaves the polysilicon layer in a grown-in tensile state of stress which causes the structure to bow.

One method of reducing the bowing of DI wafers is disclosed in U.S. Pat. No. 3,862,852 issued to T. I. Kamins on Jan. 28, 1975. Kamins discovered that the presence of oxygen in the gas used to deposit the polysilicon resulted in increasing the warpage. Accordingly, Kamins discloses a method of depositing polysilicon in a gaseous environment in which the ratio of oxygen atoms to hydrogen atoms is minimized. For example, he uses an oxygen concentration of less than ten parts per million parts hydrogen when the polysilicon is deposited at 1100° C. at a rate of 4 microns per minute. However, it has been determined that as the deposition temperature or the deposition rate decreases, the amount of oxygen which can be tolerated likewise decreases, resulting in a set of operating conditions which is extremely difficult to control.

Another known method of preparing DI wafers is disclosed in U.S. Pat. No. 4,079,506 issued to T. Suzuki et al on Mar. 21, 1978 and further discussed in an article entitled "Deformation in Dielectric-Isolated Substrates and Its Control by a Multilayer Polysilicon Support Structure" by T. Suzuki et al appearing in the *Journal of the Electrochemical Society*, Vol. 127, No. 7, July 1980 at pp. 1537-1542. Suzuki et al believes that the deformation of substrates during DI processing occurs during both the polysilicon deposition and subsequent oxidation/diffusion for junction formation. The former kind of deformation is caused by the tensile component of the stress generated through the high temperature contraction of the polysilicon. The latter type of deformation is compressive in nature and is caused by the differential oxidation rate between the top polysilicon layer and the single crystal substrate. In the Suzuki et al technique, a plurality of silicon single-crystal regions are supported by a laminated structure comprising an alternate stacking of oxide films and polycrystalline silicon (polysilicon) layers. A silicon oxide film is interposed between the single-crystal regions or islands and the multiple layer support structure for isolating the regions from one another as well as from the support structure. According to this known method, the formation of three to twelve silicon polycrystalline layers in the support structure can reduce bendings of the substrate resulting from the growth stress of the polycrystalline layers. An improved method of providing this laminated structure is disclosed in U.S. Pat. No. 4,310,965 issued to J. Horiuchi et al on Jan. 19, 1982. The improved technique relates to limiting the thickness of each layer in the interposed structure in associated with the equation $x < (y/40)$, where x is the thickness of each layer (in microns) and y is the ultimate thickness of the substrate.

Although these above-described known techniques appear to solve the bending or warpage problem, the use of such an alternate multiple layer structure results in a delicate, time consuming, as well as expensive, method for manufacturing isolated single-crystal regions. Moreover, the deposition of the polyorystalline layers takes place at high temperatures capable of deleteriously effecting the characteristics of the silicon single crystal tub regions.

SUMMARY OF THE INVENTION

The foregoing problems associated with the prior art have been solved in accordance with the present invention, which relates to a method of controlling warpage in DI wafers and, more particularly, to a method of controlling warpage utilizing a multilayering technique to grow the polysilicon which consists of alternating growth rates via adjustments in growth parameters.

It is an aspect of the present invention to provide a process which consists of the deposition of a continuous, relatively coherent, nucleation layer onto which multiple layers of polysilicon are deposited using programmed discontinuities in any growth parameter. The discontinuities may include, for example, temperature, composition, or doping.

Another aspect of the present invention is to provide both accommodation and reduction of the growth stress generated during polysilicon deposition. Stress accommodation is achieved by substructural layering to create psuedo interfaces in the support structure by deliberate, periodic oscillations in a selected growth parameter during polysilicon deposition. Stress reduction is achieved by utilizing a substantial part of the growth stress to initiate strain-induced recrystallization in the nucleation layer which is caused by lattice instabilities and strain fields set up during multilayering.

A further aspect of the present invention is the characterization and optimization of the multilayering process by means of X-ray diffraction (XRD) peak profiling of Si (400), (331), (333), (440) and (531) reflections of the deposited polysilicon layer. The internal stress, defect state, and degree of <110> texture of the polysilicon film are measured (at different depths in the support structure) from the Si (440) peak position shift, peak broadening, and relative intensity, respectively, in order to provide a better understanding and optimization of the process.

Other and further aspects of the present invention will become apparent during the course of the following discussion and by reference to the accompanying drawings.

BRIEF DESCRIPTION OF THE DRAWINGS

Referring now to the drawings,

FIG. 3 illustrates the polysilicon morphology at various stages of the thermal multilayering process;

FIG. 8 illustrates the polysilicon morphology at various stages of the chemical multilayering process.

DETAILED DESCRIPTION

Figure 1:
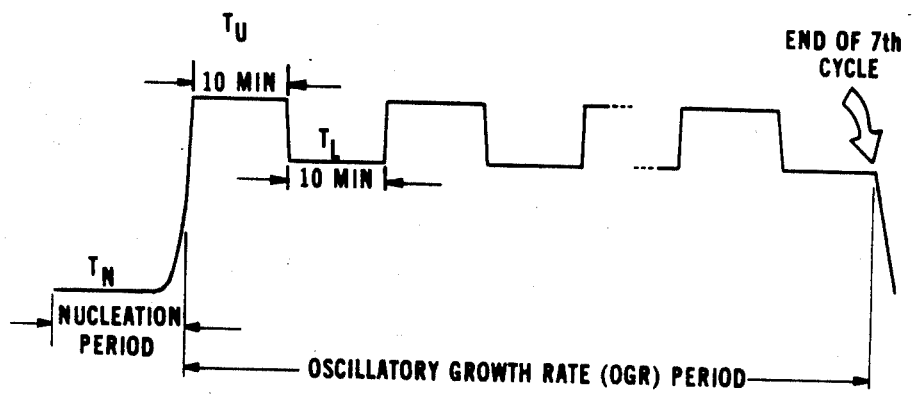
FIG. 1 illustrates the growth sequence for thermal multilayering in accordance with the present invention.

Severe uncontrolled and unpredictable dielectrically-isolated (DI) wafer warpage during polysilicon deposition by a conventional chemical vapor deposition (CVD) process ($H_2$ reduction of $SiHCl_3$), or the direct evaporation of silicon by an electron beam, has resulted in the conclusion that the primary cause of wafer deformation and defect incorporation is due to the large internal stress generated during the polysilicon growth. The severity of the internal stress problem increases significantly when the following factors are considered: (i) <110> is the preferred texture in polysilicon films; (ii) relatively high temperatures are associated with polysilicon deposition; (iii) a large thickness (~550 microns) of polysilicon support structure is needed to fill tubs and provide support and reference for a typical DI substrate; and (iv) many processes are now using large area DI wafers on the order of 100 mm or 125 mm diameter. Therefore, important considerations in reduction of the internal stress generated during polysilicon growth have to be made for any process development in DI wafer fabrication. A complete elimination of internal stress is not possible. However, in accordance with the process of the present invention, accommodation of the growth stress by substructural layering is achieved by deliberate periodic oscillations in growth parameters during polysilicon deposition, thus creating psuedo or real interface in the support structure. It is to be noted that the concepts of substructural layering and stress accommodation by fluctuations in growth kinetics as described in detail hereinafter are not limited to polysilicon deposition. Rather, the techniques of the present invention can be utilized in association with various other elemental, alloy, or compound semiconductor deposition processes where control of stress and defect density is important. Further, these concepts can be used in modifying the numerous thermal treatments associated with the fabrication of various electronic devices to optimize their performance and reliability.

The process according to the present invention may be accomplished by periodically varying any of the known growth parameters, including, but not limited to, temperature, composition, or doping. One exemplary process, referred to hereinafter as the thermal multilayering (TML) polysilicon deposition process, first involves the deposition of a nucleation layer at a temperature lower than is used during the rest of the process. Once the nucleation layer has been formed, the remaining polycrystalline material is grown at elevated temperatures which are deliberately varied in a preprogrammed cyclic manner over a fixed period of time. The strain field produced by the multilayering thermal sequence generates structural instabilities in the polysilicon film which often induces recrystallization in the nucleation layer. An alternative method, referred to as chemical multilayering (CML), achieves substructural layering by periodic fluctuations in $H_2$:$SiHCl_3$:$SiH_4$ relative concentrations under isothermal conditions. Both thermal and chemical multilayering techniques for depositioning polysilicon are discussed in detail below.

I. THERMAL MULTILAYERING DEPOSITION PROCESS

The thermal multilayering polysilicon deposition of the present invention is shown schematically in FIG. 1. This process involves two distinct parts which are made up of the following:

(i) An initial nucleation period which has been optimized at 1100° C. for 20 minutes for the gas composition which is defined below; and (ii) An oscillatory growth rate period (OGR) which contains several repeat cycles of growth at two fixed temperatures, each of which is maintained of a period of, for example, ten minutes, giving an exemplary cycle length of 20 minutes. For the gas composition to be described, seven of these cycles resulted in the desired polysilicon thickness for either 75 or 100 mm diameter DI wafers.

The thermal multilayering process is a CVD polysilicon deposition process involving the high temperature hydrogen reduction of trichlorosilane (SiHCl$_3$) on DI substrates consisting of high resistivity, single crystal silicon covered with 3–4 microns of thermally grown SiO$_2$. The temperature cycling may be controlled by an IR optical pyrometer which is under the control of a microprocessor. This microprocessor can also control the sequencing of reactant and carrier gases through the system. An average growth rate of 4.0 microns/minute at 1180° C. is obtained from a H$_2$:SiHCl$_3$ mixture with a mole fraction of trichlorosilane of 0.047 and a total H$_2$ flow of 110 liters/minute, where the mole fraction of SiHCl$_3$, defined X$_{SiHCl_3}$ is found from the relation $$X_{SiHCl_3} = \frac{\text{moles SiHCl}_3}{(\text{moles of SiHCl}_3 + \text{moles H}_2)} \quad (1)$$

Referring to FIG. 1, the first step in the thermal multilayering process is the formation of the nucleation layer. The polysilicon nucleation layer is formed on top of the isolation oxide present on the surface of the DI wafer and is grown at a lower temperature and hence lower rate than the polysilicon associated with the OGR period of the process. For example, temperatures of 950° to 1150° C. with the gas conditions given above produce average growth rates during a 20 minute nucleation time of between 2.4 to 3.5 microns/minute. The initial stress built up in the composite structure is a function of this temperature and is discussed in detail hereinbelow. This nucleation layer is extremely important to the process of the present invention, and it is to be noted that the nucleation layer must comprise a relatively coherent and continuous film so that subsequent polysilicon growth during the OGR period will occur on a nearly continuous sheet of nucleation centers rather than on more isolated, energetically favored, discrete sites.

Following the formation of the nucleation layer, the oscillatory growth period is initiated, as seen by reference to FIG. 1. Periodic oscillation in growth for multilayering may be attained by fluctuating the growth temperature approximately 30 degrees centigrade between an upper temperature limit, defined as T$_U$, and a lower temperature limit, referred to as T$_L$. For example, oscillating the process temperature between a T$_U$ of 1180° C. for 10 minutes and a T$_L$ of 1150° C. for 10 minutes for a predetermined number of cycles has been found to generate a sufficient polysilicon thickness. Specifically, by using seven temperature cycles, a polysilicon layer of approximately 550 microns can be formed. It is to be understood that the temperatures T$_U$ and T$_L$ may vary by as much as, for example, 20 degrees as long as the temperature differential remains at approximately 30 degrees. It is to be understood perturbations in the deposition by changing the amplitudes (T$_U$−T$_L$) and frequency (isothermal holding time at T$_U$ or T$_L$) will still allow for the creation of a multilayered structure in accordance the process of the present invention, where only the rate of deposition, final layer height, and number of pseudo layers will be modified.

Figure 2:
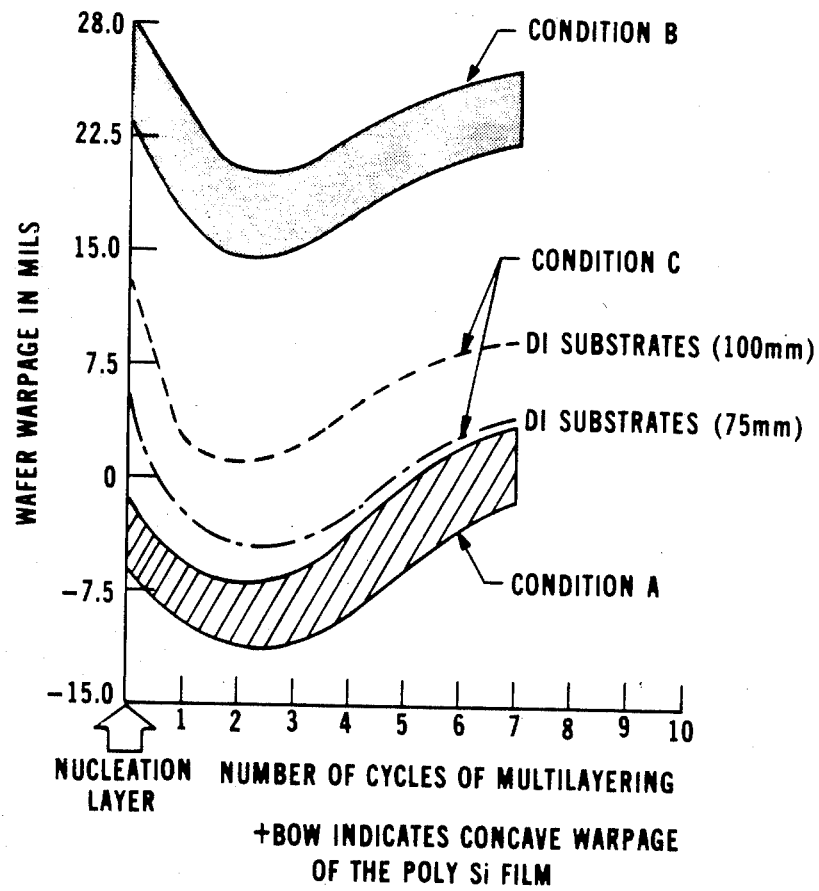
FIG. 2 illustrates the warpage of dielectrically-isolated (DI) wafers at various stages of the sequence shown in FIG. 1.

FIG. 2 illustrates the wafer warpage which results when the oscillatory growth rate (OGR) period is terminated after different numbers of cycles of multilayering for various DI substrates. Condition "A" corresponds to a relatively low nucleation temperature (between 950° and 1100° C.) for a time between 10 and 20 minutes to generate a polysilicon film thickness of about 30 to 75 μm. More importantly, condition "A" refers to the state of stress in the nucleation layer as described by the Si (440), 2θ peak position of the top 8–10 μm layer to be ≧107°, as compared to the annealed powder value of 106.88° with a zero or negative warpage (i.e., convex configuration when viewed from the polysilicon side). A nucleation temperature of approximately 1150° C. (or above) and a deposition time of 10 to 20 minutes defines condition "B" which produces a polysilicon layer with Si (440), 2θ peak positioning of the top 8–10 μm surface less then 106.8° with positive bowing (i.e., concave warpage viewed from the polysilicon side). The samples used in forming FIG. 2 included 75 and 100 mm diameter wafers of ungrooved, shallow, or deep grooved design under nucleation conditions "A" and "B" with all other deposition conditions remaining unaltered. Additionally, FIG. 2 shows the variation in the wafer deformation after each cycle of multilayering on 75 and 100 mm deep grooved DI substrates using a two-step nucleation process called condition "C". This involves deposition at 1100° C. for 5 minutes followed by 5 minutes at 1150° C. The stress generated by condition "C" produces a mechanical state in polysilicon layer somewhere between conditions "A" and "B".

The change in wafer warpage at various stages of multilayering is seen to illustrate similar trends irrespective of the nucleation condition (A, B, or C), size (75 mm or 100mm) and type (shallow or deep grooved) DI substrates. As seen by reference to FIG. 2, the observed wafer warpage changes drastically during the initial part of the OGR period. Starting from its value obtained during nucleation, this observed value first goes in a negative direction and passes through a minimum around the second cycle followed by a continuous increase (somewhat slower rate of increase from the fifth to seventh cycle) with subsequent cycles of multilayering. FIG. 2 clearly shows that the initial warpage generated during the nucleation period is crucial in dictating the final "bow" of the DI substrates.

The mechanical state of DI wafers obtained using the thermal multilayering process of the present invention is the net effect of internal stress incorporated as the polysilicon film grows thicker and the stress accommodation triggered by the periodic temperature fluctuations. The interaction of these two opposing effects result in an inflection in the observed wafer warpage between the first and third cycles of multilayering. The occurrence of this inflection in the wafer warpage, as discussed above, is independent of nucleation condition (A, B, or C) or the size (75 mm or 100 mm) of the DI wafers. This indicates that at this point in its growth, the polysilicon layer is experiencing a mechanical instability. Such instabilities can give rise to phase transformation if the necessary free-energy requirements can be met, where the strain field generated by the present layering process is believed to provide the necessary energy to initiate recrystallization in the nucleation layer, assuming the internal stress in the nucleation layer is above a critical value. It has been found empirically that this critical value is met if the 2θ position of the Si (440) peak of the nucleation layer, measured on samples pulled from the reactor after the nucleation step, is greater than 107.0°. This value was found to be good for both 75 mm and 100 mm wafers and represents the lower band described as Condition "A" on FIG. 2 and the lower curve (75 mm wafers) for the nucleation condition "C". When the stress in the nucleation layer described by the (440), $2\theta$ peak position is below this critical value of 107.0° for polysilicon films grown under the nucleation condition "B", subsequent polysilicon growth on these nucleated layers do not show any recrystallization in spite of the mechanical instability created during the OGR period in the upper band (condition "B") and the upper curve (condition "C") in FIG. 2. Therefore, the polysilicon nucleation layer must be above the critical state of stress, or a threshold value, described by the Si (440) peak position for strain-induced recrystallization to occur about the second cycle of multilayering. In other words, both the critical state of stress in the nucleation layer and some lattice instabilities are needed for initiating recrystallization in the poly nucleation layer, which in accordance with the present invention, are created by the deliberate oscillation in the deposition temperature.

The onset and subsequent regrowth of strain-induced recrystallization in the polysilicon layer near the $SiO_2$ interface is shown in FIG. 3, which contains SEM micrographs of the polysilicon support structure near the isolation oxide interface for both 75 mm and 100 mm diameter grooved DI substrates after both three (FIG. 3(a)) and seven (FIG. 3(b)) thermal multilayering cycles with condition "A" nucleation. The SEM micrographs of the polysilicon layer near the polysilicon-$SiO_2$ interface after the remaining cycles (2, 4, 5, and 6) are not shown in FIG. 3. Recrystallization occurs after the second cycle of multilayering (not shown) in the fine-grained (0.1-0.3 $\mu m$) region adjacent to the $SiO_2$ interface with a <100> texture. The polysilicon-$SiO_2$ interface after the third thermal cycle shown in FIG. 3(a) indicates the growth of those previously formed (after the second cycle) recrystallized Si grains up to 30 $\mu m$ in size and located predominantly in the ungrooved areas. Additional nucleation and regrowth also occurs in this fine-grained region after the third thermal multilayering cycle. Between the fourth and sixth cycle of thermal multilayering (not shown in FIG. 3) no new recrystallization sites appear to form; however, substantial growth on the recrystallized Si grains occurs which increases their size to approximately 100 $\mu m$. This recrystallized layer now forms a continuous sheet of large-grained silicon adjacent to the isolation oxide, as shown in FIG. 3(b). It is to be noted that there is no detectable morphological change after the seventh thermal cycle of multilayering, except for the increase in thickness of the columnar Si grains ($\sim 3.0\ \mu m$) with a strong <110> preferred orientation.

EXAMPLE I

The deposition cycle begins by introducing the stabilized $SiHCl_3$: carrier $H_2$ gas mixture into a reactor chamber after the thermal stabilization of the susceptor at 1100° C. The nucleation phase takes place during the first fifteen minutes of the polysilicon deposition. The $H_2$:$SiHCl_3$ reactant gas mixture with a 0.13 mole fraction of $SiHCl_3$ is obtained by bubbling 33.5 liters/minute of $H_2$ through two 100 pound $SiHCl_3$ source bottles connected in series. The concentration of $SiHCl_3$ which affects the deposition rate, is a very sensitive function of the temperature of the $SiHCl_3$ source tank and the carrier hydrogen flow rate. As deposition proceeds and the carrier hydrogen gas bubbles through the $SiHCl_3$ liquid, the temperature of both tanks will decrease with time. In fact, the temperature decrease will be greater for the first tank than the second tank. The temperature of the second tank is the only one which is important and should not vary by more than 5° C. during the run or from run to run. A typical 1° to 4° C. decrease in the temperature should be observed in the second tank (starting at 25° C.) at a carrier hydrogen flow of 33.5 liters/minute to maintain an average 0.13 mole fraction of $SiHCl_3$ in the carrier gas mixture. The source mixture is further diluted by the main stream hydrogen (75 liters/minute) to a 0.047 mole fraction of $SiHCl_3$ in the reactor chamber.

After completion of nucleation, the first cycle of the OGR period starts with a five minute temperature ramp to $T_U$ (1180° C.) for ten minutes followed by a thermal quench to $T_L$ (1150° C.), by programmed reduction of rf power, and continued deposition for ten minutes at $T_L$. The second and other subsequent multilayering cycles are the same as the first, except the initial temperature ramp from $T_L$ to $T_U$ takes only two minutes. Typical average growth rates for the temperatures of interest and for mole fraction $SiHCl_3 = 0.047$ are given in the following table.

| Brightness Temperature °C. | Average Growth Rate ($\mu m$/minute) |
| --- | --- |
| 1100 | 2.4 |
| 1150 | 3.5 |
| 1180 | 4.0 |

After the end of the seventh complete cycle, the deposition is stopped by turning off the $SiHCl_3$: carrier $H_2$ gas mixture and the rf heat source and allowing the system to cool below 650° C. in the mainstream $H_2$ (75 liters/minute) for ten minutes. Subsequent cooling to room temperature is done under $N_2$-purge.

II. CHEMICAL MULTILAYERING DEPOSITION PROCESS

Figure 4:
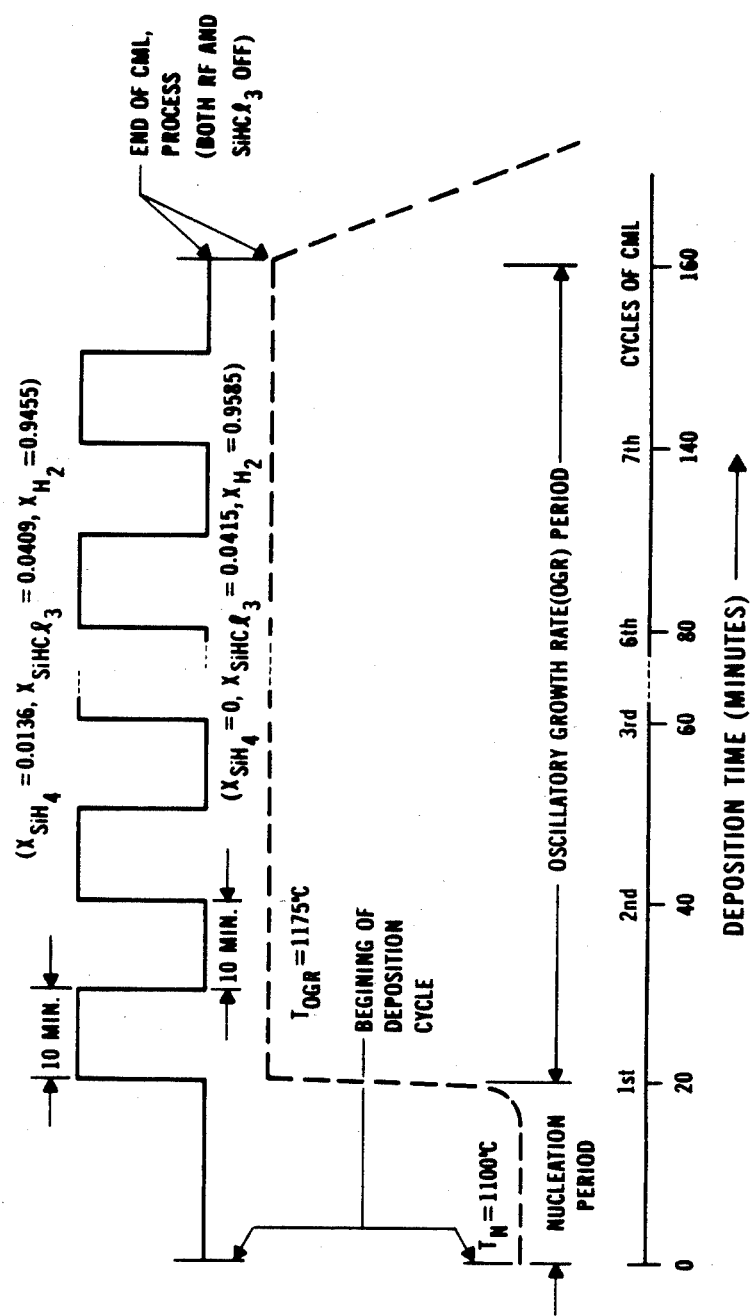
FIG. 4 illustrates the growth sequence for chemical multilayering in accordance with the present invention.

The chemical multilayering polysilicon deposition process of the present invention is shown schematically in FIG. 4. Like the above-described thermal multilayering process, the chemical process involves an initial nucleation period and a subsequent oscillatory growth rate (OGR) period. The chemical OGR period contains several repeat cycles of growth at two fixed relative concentrations of the reactants ($SiHCl_3$, $SiH_4$ and $H_2$) under isothermal conditions at 1175° C. Like the thermal process, it has been found that periods of 10 minutes at each concentration (giving a cycle length of 20 minutes) are considered satisfactory for yielding desired thickness of polysilicon in the seven complete cycles.

Like the above-described thermal process, the chemical multilayering process is a CVD polysilicon deposition process from the hydrogen reduction of silicon containing gaseous reactants on DI substrates (high resistivity (100)-oriented silicon substrates covered with a 3-4 micron thermally grown $SiO_2$ layer). Growth rates of 4.10, 3.75, and 3.55 $\mu m$/minute may be obtained for $SiHCl_3$ mole fractions of 0.05, 0.04, and 0.03, respectively, and a total $H_2$ flow of 110 liters/minute at 1175° C. A higher polysilicon growth rate of 4.35 $\mu m$/minute can be achieved by using a small concentration of $SiH_4$ (mole fraction of 0.0136) in the reactant mixture of $SiHCl_3$ (mole fraction 0.0409) and $H_2$ (mole fraction 0.9455) gases. The mole fractions of SiH$_4$ and SiHCl$_3$ can be defined as follows:

$$X_{SiHCl_3} = \frac{\text{moles of SiHCl}_3}{\text{moles of SiHCl}_3 + \text{moles of SiH}_4 + \text{moles of H}_2}$$

and $$X_{SiH_4} = \frac{\text{moles of SiH}_4}{(\text{moles of SiHCl}_3 + \text{moles of SiH}_4 + \text{moles of H}_2)}$$

To begin the chemical multilayering process, a polysilicon nucleation layer is grown on top of the isolation oxide layer at a lower temperature and hence lower rate than that growth during the subsequent OGR period. This nucleation layer, similar to the nucleation layer associated with the above-described thermal process, is extremely important to the process of the present invention and should be a relatively coherent and continuous film so that subsequent polysilicon growth during the OGR period will occur on a nearly continuous sheet of nucleation centers rather than on more isolated, energetically favored, discrete sites. A temperature of 900° to 1125° C. with the gas composition given above will produce average growth rates during a 20-minute deposition time of 1.5 to 3.0 μm/minute.

Referring to FIG. 4, the osillatory growth rate period begins at the completion of the nucleation process. Multilayering in accordance with the chemical process is attained by the fluctuations in relative concentrations of SiHCl$_3$, SiH$_4$ and H$_2$ under the isothermal condition of 1175° C. for a sufficient number of cycles to generate the desired polysilicon thickness. In particular, each chemical multilayering cycle consists of a higher polysilicon growth rate of approximately 4.35 μm/minute in the first half cycle for 10 minutes followed immediately by a lower growth rate of 3.75 μm/minute in the second half for 10 minutes. The higher growth rate may be attained by periodic injection of SiH$_4$ in the reactant gas mixture $X_{SiH_4}=0.0136$, $X_{SiHCl_3}=0.0409$ and $X_{H_2}=0.9455$. In comparison, no SiH$_4$ is used in the second half of the cycle ($X_{SiHCl_3}=0.0415$ and $X_{H_2}=0.9585$).

Figure 5:
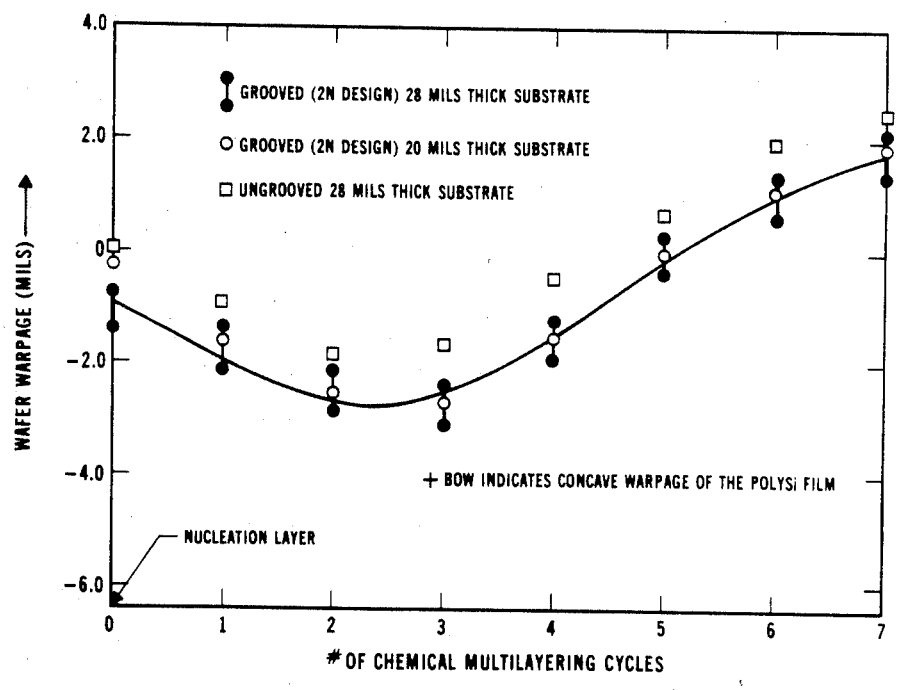
FIG. 5 illustrates DI wafer warpage at various stages of the chemical multilayering sequence shown in FIG. 4.

The mechanical state of DI substrates at various stages in the OGR period of the chemical multilayering process may be characterized by the wafer deformation as measured with a conventional Heidenhain gauge and the X-ray diffraction (XRD) line profiling of (440), (422) and (531) peaks obtained from the top 8-10 μm layer of the polysilicon films. FIG. 5 shows the typical wafer warpage which results when the OGR period is terminated after different cycles of chemical multilayering for various DI substrates. Both ungrooved and thin (20 mils) DI substrates show slightly higher warpage than that of a standard 28 mils thick grooved wafer. However, the trend in wafer warpage variation after the various cycles of multilayering remain unaltered irrespective of thickness and groove design in DI substrates. The mechanical state of DI wafers by multilayering in accordance with the present technique is the net effect of internal stress incorporation as the poly films grow thicker and the stress accommodation triggered by the growth rate fluctuation. The interaction of these two opposing effects results in an inflection in the observed wafer warpage between the first and third cycles of multilayering.

The polysilicon textural and substructural characteristics at different depths within the support structure can be determined by terminating the deposition schedule at various stages of growth and utilizing X-ray diffraction (XRD) line profiling of the polysilicon layer surfaces at the resulting thicknesses. It is to be noted that all diffraction lines are the volume average of a sample size typically 3-3.5 cm$^2$ of irradiated polysilicon area and a depth 8-10 μm penetrated by CuK$_\alpha$ radiation. XRD line profiling of these silicon peaks (CuK$_{\alpha 1}$ lines) involves accurate determination of:

(a) the peak position
(b) the peak broadening, and
(c) the relative peak area.

In the absence of any lattice dilatation and excessive faulting, the Si (440) peak positions are direct measures of the internal growth stress in polysilicon layer. The peakbreadth is a convolution of crystallite size, microstress within crystallites, and imperfections within the irradiated volume of the polysilicon film. The width at half-maximum intensity (FWHM) of K$_{\alpha 1}$ (440), (422), (333) and (531) lines are utilized to describe the substructure or defect state of the polysilicon layer at different depths in the polysilicon film at various stages of processing. The relative peak area of (440) with respect to the other reflections (i.e., (422), (333), and (531)) at different depths in the polysilicon layer is a measure of the degree of <110> texture at various stages of polysilicon growth.

Figure 6:
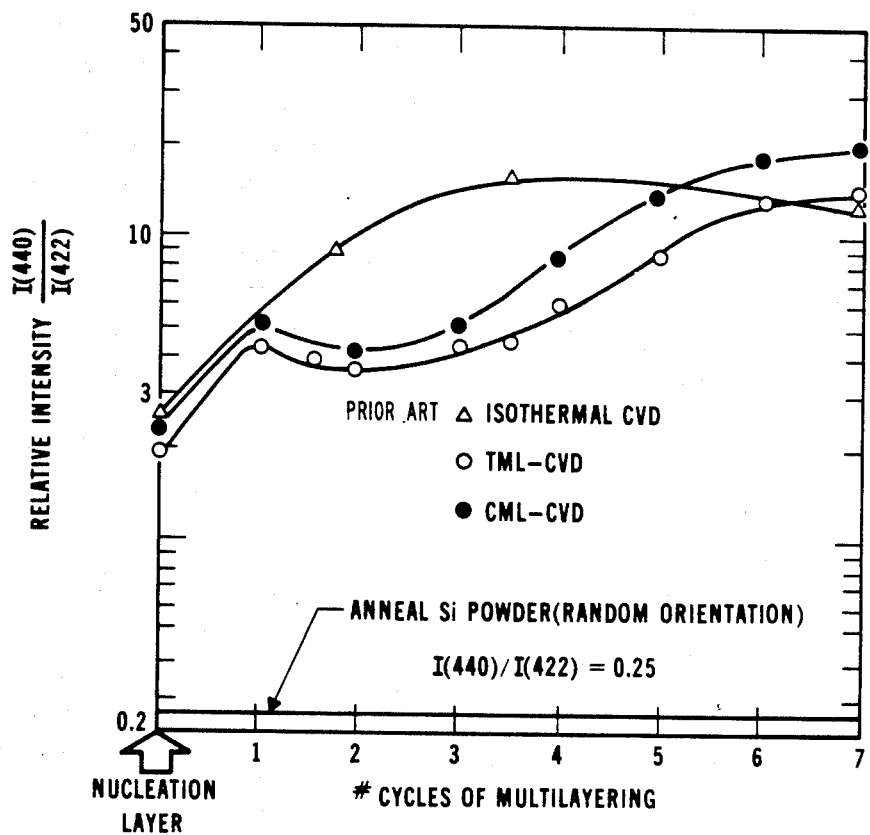
FIG. 6 illustrates the variation in the degree of <110> texture in the polysilicon layer at various stages of the multilayering process.

FIG. 6 illustrates the variation in the relative intensity of (440) with respect to (422), denoted I(440)/I(422), at the end of various stages of the chemical multilayering process. Similar plots of I(440)/I(531) and I(440)/I(333) are not shown due to redundancy. Also shown for comparison are similar measurements made on polysilicon layers which were grown under both the prior art 1175° C. isothermal conditions and by the thermal multilayering process of the present invention, all processes using the same nucleation condition A. Various thicknesses of the polysilicon layer were attained during the isothermal process (T=1175° C. $X_{SiHCl_3}=0.047$, and $X_{H_2}=0.953$) by varying the deposition time. Data points Δ shown in FIG. 6 illustrate the X-ray information obtained from shortened isothermal runs of 40, 75, and 140 minutes to generate equivalent polysilicon thickness obtained by 2, 3, 5, and 7 cycles of the multilayering process. The conventional isothermally deposited polysilicon layers show that I(440)/I(422) increase with increase polysilicon thickness, and saturates at a thickness of approximately 250-300 μm. There is no further increase in the value of I(440)/I(422) or the degree of <110> texture for thicker layers. I(440)/I(422) obtained from nucleation layers (50-60 μm thick) always exhibit values equal to or greater than 2, indicating that <110> growth, and hence (110) islands, are kinetically favored during the initial nucleation and subsequent growth of these polysilicon films. The growth of these (110) planes, once nucleated, is virtually unimpeded by the slow growing {111} faces. Since the surface energy of the (110) plane (~1500 ergs/cm$^2$) is relatively high, the crystallites tend to grow in the [110] direction rather than in the (110) plane. The increase in the <110> texture is quite similar for both the conventional isothermal and novel multilayering (TML and CML) growth conditions, shown in FIG. 6, for the first 20 minutes of growth after nucleation. After this initial 20 minute period, however, the <110> texture begins to differ, depending on the growth conditions. As mentioned above, the conventional isothermal conditions result in an increased amount of <110> texture with polysilicon growth, where this growth begins to saturate approximately 75 minutes into the process. For both the TML and CML processes of the present invention, however, a change in the ratio of <110> texture is polysilicon growth begins after the first ML cycle, and the large <110> signals are not recovered until after five complete cycles. This indicates that there are structural rearrangements within the polysilicon layer that are taking place which in effect reduce the degree of <110> texture on the top 8–10 μm layer of the polysilicon. This structural anomaly is reflected in Bragg broadening data of the Si (440) reflection.

Figure 7:
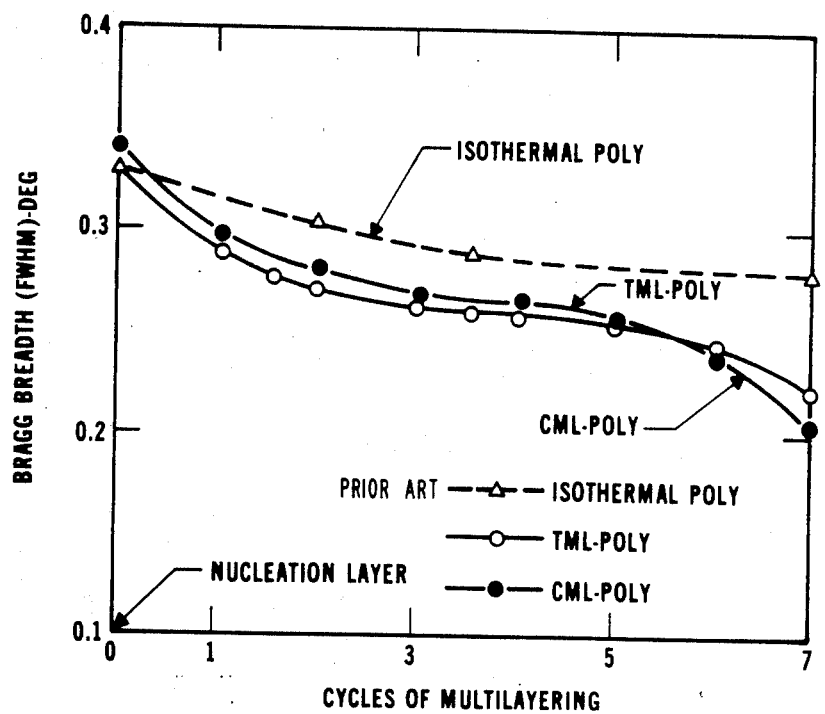
FIG. 7 illustrates the variations in Bragg broadening in Si (440) reflection at various stages of the multilayering process associated with FIG. 6.

FIG. 7 illustrates the variation in the (440) line widths obtained from the top 8–10 μm of polysilicon layers removed from the reactor after various CML cycles, the same polysilicon layers described in association with FIG. 6. The Bragg widths, which are characterized by their FWHM (width at half-maximum intensity), qualitatively describe the substructure and defect state of the polysilicon layer after each of ML cycle. For comparison, Bragg broadening data for Si (440) peaks associated with both the isothermal and thermal multilayering processes are shown. Peak broadening for the reflections (422), (333), and (531) are not illustrated for the sake of clarity. The polysilicon layers deposited by the prior art method show a slight decrease in the relatively large value of FWHM with increasing polysilicon thickness up to a thickness of approximately 250 μm. As seen by reference to FIG. 7, there is no visible decrease in the value of FWHM for thicker layers. The polysilicon films deposited by the ML process of the present invention, however, show a greater decrease in FWHM up to the completion of the second ML cycle, due to an increase in the degree of <110> texture with the increase in thickness of the polysilicon layer. Between the second and fifth cycles of the multilayering process, there is very little change in FWHM in spite of the increase thickness, indicating again that there are structural rearrangements taking place within the polysilicon layer. Beyond the fifth multilayering cycle, thermal or chemical, the decrease in FWHM for all the reflections stated above may be attributed to an increase in the <110> texture with an increase in the polysilicon thickness. The mechanical instability indicated by the inflection in wafer warpage, as shown in FIGS. 2 and 5, and the structural anomaly reflected in the Si (440) peak profile data of FIGS. 6 and 7 around the second cycle of multilayering, occur due to the recrystallization in the nucleation layer.

FIG. 8 illustrates, in cross-section, SEM micrographs of cleaved, polished and etched polysilicon layers after the nucleation period and first, fourth and seventh cycles of the chemical multilayering process. The SEM micrograph of the polysilicon layer near the polysilicon-SiO₂ interface after the other multilayering cycles (2, 3, 5 and 6) are not shown in FIG. 8. Recrystallization occurs after the second cycle of multilayering (not shown) in the fine-grained (0.1–0.3 μm) region adjacent to the SiO₂ interface with a <100> texture. The photograph shown in FIG. 8(c), associated with sample removed after four cycles of CML in accordance with the present invention, shows that the recrystallized Si grains, which begin to nucleate during the second cycle, continue to grow and attain a size of almost 30 μm by the end of the fourth cycle. These grains are located predominantly in the ungrooved and slightly above the SiO₂ interface. Additional nucleation and regrowth also occurs in this fine-grained region subsequent to the fourth multilayering cycle. Between the fourth and sixth cycles of multilayering (not shown) no new recrystallization sites appear to form; however, substantial growth on the recrystalized Si grains occurs, which increase the size of these grains to approximately 100 μm. This recrystallized layer now forms a continuous sheet of large-grained silicon adjacent to the isolation oxide, where all of the nucleation layer is believed to have been regrown into this layer. No distinct morphological change is apparent after seven complete multilayering cycles, except for the increase in thickness of the columnar Si grains to approximately 3 μm with a strong <110> preferred orientation.

Figure 9:
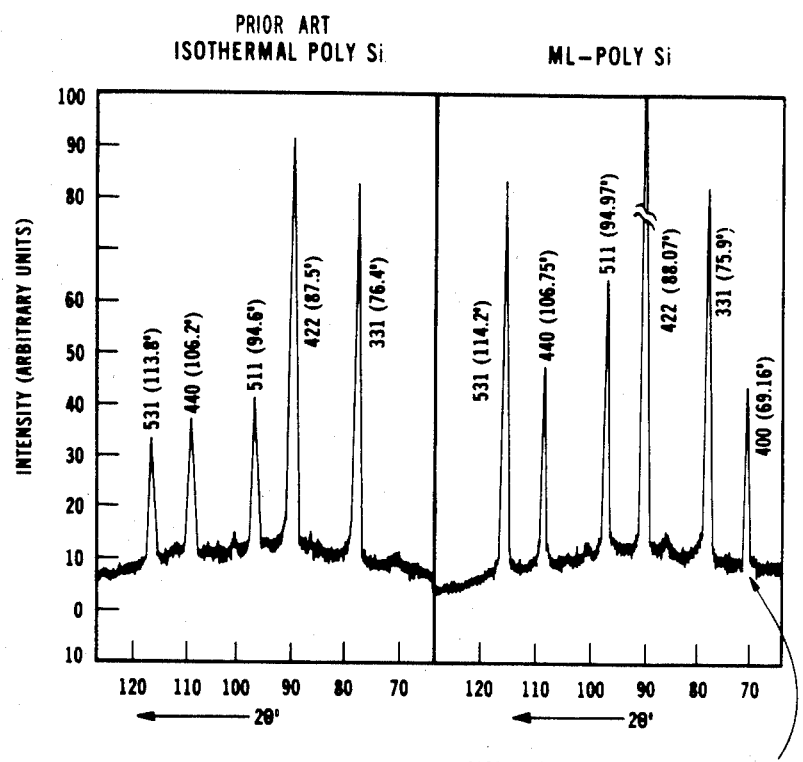
FIG. 9 illustrates the X-ray diffraction spectrum of the polysilicon support structure, near the isolation oxide interface, deposited under both multilayering and isothermal growth conditions.
Figure 9:
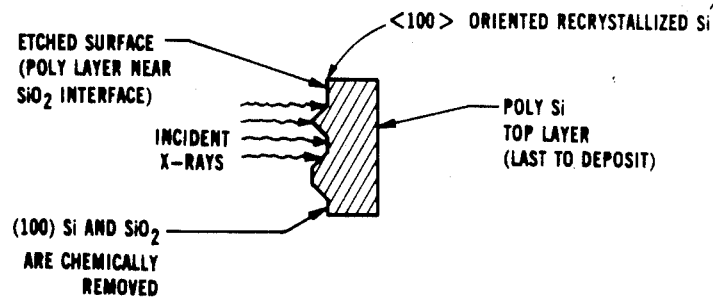

XRD measurements of the polysilicon layer near the SiO₂ interface after the complete deposition of the polysilicon structure in accordance with the present invention can be made by chemically removing the (100) Si substrate by 10N KOH solution at 80° C., removing the isolation oxide with a 48% HF solution, and irradiating the etched surface with CuK$_\alpha$ X-rays. FIG. 9 illustrates X-ray diffractograms of polysilicon films near the polysilicon/SiO₂ interface, for both the conventional isothermal polysilicon deposition process and the ML process of the present invention (chemical or thermal). The presence of the (400) reflection from the CML films, as well as the TML films, indicate that these large recrystallized grains have the <100> texture. The energy required to rearrange the atoms from the <110> to this <100> texture is provided by the strain field produced by the multilayering technique of the present invention. Under the deposition conditions used in this example, at least two complete ML cycles are required to initiate recrystallization. It is to be noted, however, that the number of cycles required for Si recrystallizations will vary with both the amplitude and the length of the temperature cycle for thermal multilayering, and the composition cycle (SiH₄:SiHCl₃:H₂) for chemical multilayering.

The main features of this stress induced recrystallization of the polysilicon layer can be summarized as follows:

(a) The (100) oriented recrystallized crystallites nucleate in the fine-grained (0.1–0.3 μm) first-to-deposit nucleation layer, rather than at the polysilicon/SiO₂ interface, where this fine-grained region possesses the highest strain field and the maximum density of low angle boundaries.

(b) The recrystallized Si nuclei grow with a <100> texture in the fine-grained region by growing on newly formed high angle boundaries until they impinge on each other or on columnar grains located above the nucleation layer. The latter are at least 2 μm in cross-section and are consumed only to a small extent during the transformation of the fine-grained region. This recrystallization process substantially reduces the internal growth stress within the polysilicon layer.

EXAMPLE II

The deposition cycle begins by introducing the stabilized SiHCl₃:carrier H₂ gas mixture into the reactor chamber after the thermal stabilization of the susceptor to 1100° C. The nucleation phase takes place during the first fifteen minutes of polysilicon deposition. The H₂:SiHCl₃ reactant gas mixture with a 0.13 mole fraction of SiHCl₃ is obtained by bubbling 33.5 liters/minute of H₂ through two 100 pound SiHCl₃ source bottles connected in series. The concentration of SiHCl₃ which affects the deposition rate is a very sensitive function of the temperature of the SiHCl₃ source tank and the carrier hydrogen flow rate, as discussed in detail above.

After the completion of nucleation, the temperature is ramped up in five minutes to 1175° C. by a programmed increase in rf power. The onset of the first cycle of the OGR period starts by the introduction of $SiH_4$ (1.5 liters/minute) in the reaction zone for 10 minutes followed immediately by shutting the $SiH_4$ off for another 10 minutes to complete one cycle. The entire cycle is completed isothermally at a temperature of 1175° C. The second and other subsequent chemical multilayering cycles are identical to the first. All reactant gas flow and thermal sequencing is accomplished by a programmable process controller. After the end of the seventh complete cycle, the deposition is stopped by turning off the $SiHCl_3$:carrier $H_2$ gas mixture and the rf heat source and allowing the system to cool below 650° C. in the mainstream $H_2$ (75 liters/minute) for ten minutes. Subsequent cooling to room temperature is done under $N_2$-purge.

Typical average growth rates for the chemical composition of the reactant gas mixture of interest at 1175° C. are given in the following table.

| Mole Fraction of the Reactant Gases | | | Average Growth Rate |
|---|---|---|---|
| $SiH_4$ | $SiHCl_3$ | $H_2$ | (μm/minute) |
| 0.0136 | 0.0425 | 0.9439 | 4.35 |
| — | 0.0431 | 0.9569 | 3.75 |
| — | 0.0431 | 0.9569 (at 1100° C.) | 2.60 |

Figure 10:
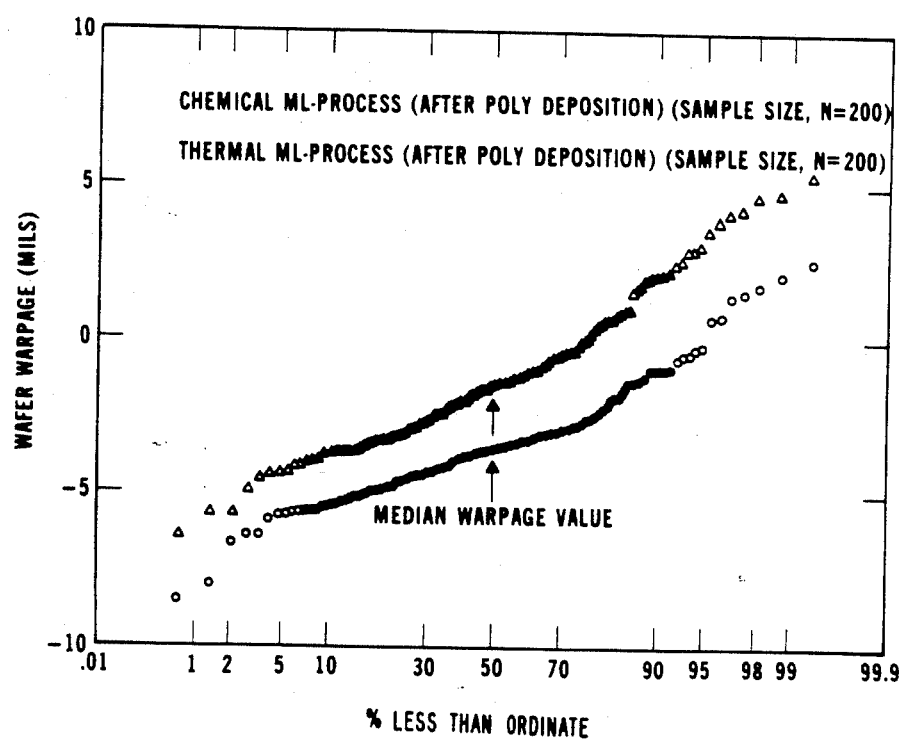
FIG. 10 illustrates the probability distribution in wafer warpage for a polysilicons support structure grown under both thermal and chemical multilayering deposition conditions.

FIG. 10 illustrates the probability distribution plot of wafer warpage for a polysilicon handle deposited using both the chemical Δ and thermal (0) multilayering processes of the present invention. Both curves contain data points from at least 200 wafers grown in different reactors. The distribution in warpage values for both the CML and TML process are slightly bimodal with their median values approximately equal to −1.2 and −3.7 mils, respectively. The bimodal distribution in wafer warpage is considered to be due to the temperature nonuniformity which may exist from wafer to wafer and also within a wafer in a particular polysilicon deposition run. Due to the similarity in the warpage distribution, it is apparent that the substructural layering and the mechanical state of DI substrates generated by both the CML and TML processes are quite similar.

Both the thermal and chemical multilayering process are derived from the same concept of substructural layering via periodic oscillations in the polysilicon growth rate. Therefore, both processes generate DI substrates with similar wafer warpage and structural characteristics. Since the growth rate of polysilicon from $H_2$:$SiHCl_3$ reduction reaction becomes essentially temperature independent above 1150° C., other variables must be used to achieve fluctuations in the growth rate. For the thermal multilayering process, the growth rate variations can be achieved by a temperature change of 30° C. where for chemical multilayering, a third reactant ($SiH_4$) may be periodically introduced to the $H_2$:$SiHCl_3$ mixture. This $SiH_4$ injection increases the growth rate from approximately 3.75 to 4.35 μm/minute, generating the desired growth rate fluctuation. This higher growth rate attained by incorporating $SiH_4$ in the $H_2$ reduction of $SiHCl_3$ reaction can be advantageous since it functions to reduce the deposition time and increase production throughput. However, the process control for chemical multilayering is somewhat more difficult than the control needed for thermal multilayering, since the growth rate is extremely sensitive to the mole fraction of $SiH_4$ and, therefore, the $SiH_4$ injection rate. Both the thermal and chemical multilayering processes of the present invention generate DI wafers with predictable and controllable wafer warpage. The most important feature of this multilayering process is the channelization of the growth stress to generate strain-induced recrystallization in the polysilicon nucleation layer. These large, <100> oriented recrystallized Si grains near the isolation oxide interface not only reduce the stress in the support structure, but also dramatically improve the dV/dt transients in the single crystal devices.

What is claimed is:

1. In a process for depositing a polysilicon layer on a substantially planar major surface of a silicon substrate so as to create a multilayered polysilicon structure which is capable of accommodating stress, performing the steps of:
   (a) growing a relatively thin oxide layer over the major surface of said silicon substrate;
   (b) forming a polysilicon nucleation layer over said relatively thin oxide layer formed in step (a) such that said nucleation layer comprises a relatively coherent and continuous film of nucleation sites and the state of stress associated with the Si (440), 2θ peak position near the top surface of said polysilicon nucleation layer is ≧107.0°;
   (c) depositing polysilicon on said nucleation layer at a first growth rate which is controlled by a predetermined growth parameter;
   (d) depositing polysilicon on said deposited polysilicon formed in step (c) at a second growth rate which is less than said first growth rate wherein the difference in growth rates is controlled by varying said predetermined growth parameter;
   (e) repeating steps (c) and (d) so as to form a multilayered polysilicon layer of a predetermined thickness.

2. The process according to claim 1 wherein deposition temperature is the controlling growth parameter used in steps (c) and (d).

3. The process according to claim 2 wherein the deposition temperature associated with step (c) is greater than the deposition temperature associated with step (d) by approximately 30° C.

4. The process according to claim 3 wherein the deposition temperature associated with step (c) is in the range of approximately 1180° to 1200° C. and the deposition temperature associated with step (d) is in the range of approximately 1150° to 1170° C.

5. The process according to claim 1 wherein deposition composition concentration is the controlling growth parameter used in steps (c) and (d) under isothermal deposition conditions.

6. The process according to claim 5 wherein the deposition composition utilized is $H_2$:$SiHCl_3$:$SiH_4$.

7. The process according to claim 6 wherein the composition used is step (c) comprises $SiH_4$, $SiHCl_3$, and $H_2$, and the composition used in step (d) comprises $H_2$ and $SiHCl_3$.

8. The process according to claim 7 wherein step (c) uses molar concentrations of 0.0136 $SiH_4$, 0.0409 $SiHCl_3$, and 0.9455 $H_2$, and step (d) uses molar concentrations of 0.0415 $SiHCl_3$ and 0.9585 $H_2$.

9. The process according to claim 1 wherein steps (c) and (d) are performed for a period of approximately ten minutes each.

10. The process according to claim 9 wherein steps (c) and (d) are repeated seven times.

* * * * *